(12) United States Patent
Miller et al.

(10) Patent No.: US 7,629,649 B2
(45) Date of Patent: Dec. 8, 2009

(54) METHOD AND MATERIALS TO CONTROL DOPING PROFILE IN INTEGRATED CIRCUIT SUBSTRATE MATERIAL

(75) Inventors: Gayle W. Miller, Colorado Springs, CO (US); Thomas S. Moss, Colorado Springs, CO (US); Mark A. Good, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 163 days.

(21) Appl. No.: 11/382,455

(22) Filed: May 9, 2006

(65) Prior Publication Data

US 2007/0264795 A1 Nov. 15, 2007

(51) Int. Cl.
*H01L 21/331* (2006.01)

(52) U.S. Cl. ............... 257/347; 257/607; 257/E21.567; 257/E29.287; 438/311

(58) Field of Classification Search ............ 438/455, 438/542, 295, 311; 257/347, 607, 610, 611, 257/782, 783, 786, E21.087, E21.088, E21.567, 257/E21.569
See application file for complete search history.

(56) References Cited

U.S. PATENT DOCUMENTS

| | | | |
|---|---|---|---|
| 6,008,110 A * | 12/1999 | Samata et al. | 438/459 |
| 6,229,177 B1 | 5/2001 | Yeap et al. | |
| 6,232,636 B1 | 5/2001 | Simpson et al. | |
| 6,313,489 B1 | 11/2001 | Letavic et al. | |
| 6,635,928 B2 * | 10/2003 | Mouli | 257/347 |
| 6,693,022 B2 | 2/2004 | Dreybrodt et al. | |
| 6,946,364 B2 * | 9/2005 | Czagas et al. | 438/455 |
| 2003/0075260 A1 * | 4/2003 | Mitani | 156/153 |
| 2003/0178678 A1 | 9/2003 | Wei et al. | |
| 2004/0075143 A1 | 4/2004 | Bae et al. | |
| 2004/0169227 A1 | 9/2004 | Wei et al. | |

FOREIGN PATENT DOCUMENTS

| | | |
|---|---|---|
| WO | WO-2007133935 A2 | 11/2007 |
| WO | WO-2007133935 A3 | 11/2007 |

OTHER PUBLICATIONS http://www.ee.byu.edu/cleanroom/ResistivityCal.phtml Brigham Young University, Department of Electrical & Computer Engineering, "resistivity & mobility calculator/graph for various doping concentrations in silicon", 2004.*

H.T.M. Pham et al., "Evaluation of In-Situ Doped PECVD SiC Thin Films for Surface Micromachining", Delft Univ. of Tech., Dimes, Laboratory of Electronic Components, Faculty of Applied Sciences, Dept. of Material Science & Tech., Delft the Netherlands, pp. 856-860.

(Continued)

*Primary Examiner*—Ha Tran T Nguyen
*Assistant Examiner*—Daniel Whalen
(74) *Attorney, Agent, or Firm*—Schwegmann, Lundberg & Woessner P.A.

(57) ABSTRACT

Methods and materials for silicon on insulator wafer production in which the doping concentration in a handle wafer is sufficiently high to inhibit dopant from diffusing from the bond wafer during or after bonding to the handle wafer.

13 Claims, 2 Drawing Sheets

OTHER PUBLICATIONS

P. Lin et al., "Multi-User Hybrid Process Platform for MEMS Devices Using Silicon-on-Insulator Wafers", Infotonics Tech. Ctr., Canandiagua, NY, USA, 4 pages.

W.A. Nevin et al., "Effect of Material Properties on Stress-Induced Defect Generation in Trenched SOI", BCO Tech. (NI) Ltd., Belfast, Ireland, U.K., 8 pages.

G.K. Geller, "Frontiers of Silicon-on-Insulator", Applied Physics Reviews, Journal of Applied Physics, vol. 93, No. 9, May 2003, pp. 4955-4978.

-, "International Application Serial No. PCT/US2007/067939, Search Report mailed Jul. 3, 2008", 4 pgs.

-, "International Application Serial No. PCT/US2007/067939, Written Opinion mailed Jul. 3, 2008", 9 pgs.

* cited by examiner

METHOD AND MATERIALS TO CONTROL DOPING PROFILE IN INTEGRATED CIRCUIT SUBSTRATE MATERIAL

TECHNICAL FIELD

The present invention relates to methods and materials used for manufacture of silicon devices, and more specifically to doping methods and doped materials for silicon manufacture.

BACKGROUND ART

Silicon on Insulator (SOI) wafers have been widely used for decades in the manufacture of silicon devices, especially integrated circuits. In SOI wafers, the wafer includes a buried oxide (BOX) layer between a bottom handle layer and an upper active layer.

One of the common methods to form SOI waters is by bonding at etching quality silicon wafer (bond wafer) to an underlying wafer (termed the "handle" water). Typically the bond wafer will have a thin thermally grown oxide surface layer, which becomes the buried oxide layer (BOX). The bond wafer is then thinned (proceeding from its original backside) by etching and/or polishing, leaving a relatively thin silicon layer, overlying a BOX layer, which in turn is disposed above a bottom handle layer.

SOI devices have a number of advantages over devices made from other types of wafers, including a high degree of transistor isolation (resulting in reduced leakage), tighter transistor density potential, reduced parasitic drain capacitance, and simplified processing. Transistors fabricated on SOI substrates generally have comparatively better operational performance at lows voltages than do similar conventionally-fabricated transistors (e.g., transistors manufactured on bulk silicon). This improved performance is in part a result of the relatively lower junction capacitances. In an SOI wafer, the buried oxide layer insulates the active transistor regions from the bulk silicon substrate of the handle wafer, reducing junction capacitance. Added advantages include high adaptability to high speed usage, high transistor count, and adaptability to low voltage applications where power consumption may be minimized to allow for greater portability.

In manufacture of SOI wafers, a dopant may be added to the crystal lattice of the silicon to modify its electronic properties. The dopants are typically found in groups III and V of the periodic table. These dopants alter the conductivity of a semiconductor by contributing either a hole or an electron to the conduction process. Because the dopants alter the conductivity of the active silicon layer, it is important that the concentration of dopants in the active layer be uniform, and that the dopant concentration remains at the desired concentration following wafer manufacturing. However, the manufacturing process of wafers tends to act against this goal.

With reference to FIG. 1, the cross sectional profile shows the dopant concentration in a typical silicon on insulator wafer. Region 10 is the active silicon wafer. This layer is 0.2 to 5 micrometers (μm) thick. Region 14 of the active silicon layer has close to the original dopant concentration, but through the depth of the active silicon layer the dopant concentration has a decreasing gradient. In region 12, the dopant concentration has depleted due to pile up or absorption in the BOX layer. The dopant concentration in the active silicon region is very poorly controlled, due to the presence of the upper, buried silicon-to-silicon glass (i.e., the buried oxide layer) interface. One effect of the upper buried oxide interface is to "segregate out" or absorb dopant atoms due to their higher solubility in the oxide compared to the silicon that it contacts.

During manufacture, an oxide layer 20, called the BOX (Buried OXide) layer is formed by thermal oxidation on the bond wafer 10. Because of higher relative solubility in oxide, dopant atoms segregate into the BOX layer 20 as the thermal oxide is grown. This segregation mechanism is the first means by which dopant depletion at the BOX (layer 20) interface of the active layer 10 arises. This bond wafer 10, with the BOX layer 20 in place, is subsequently joined to the handle wafer 30 by high (1100° C. or higher) temperature bonding. During the high temperature wafer bonding process, a second mechanism, diffusion, causes a significant portion of the dopant atoms to redistribute from the active silicon region 10 into the buried oxide region 20. In the case where the first means of dopant depletion, segregation, is defeated by growing the BOX layer 20 on the handle wafer layer 30 instead of the active or bond wafer layer 10, the effect of the second means of dopant depletion is increased. That is, although the dopant concentration in the active silicon is higher because it has not been depleted by the first means, more of the boron diffuses into the oxide during high temperature operations, simply because its concentration is higher. This leaves the active silicon layer 10 with a dopant gradient, with the highest levels of dopant in depth 14, and the most depleted area in depth 12, the area adjacent to the buried oxide layer 20. This gradient is not ideal for most silicon devices.

Therefore, what is needed is a way to address this depletion of dopant in the active silicon.

SUMMARY

A handle wafer of the present invention has a uniform distribution of dopant at a relatively high concentration. At this relatively high concentration of dopant in the handle wafer, the dopant concentration in the BOX becomes elevated also either by dopant segregation or by diffusion. With a high enough dopant concentration in the BOX, dopant is inhibited from diffusing from the active silicon into the BOX layer. In some instances, the opposite may occur, the dopant from, the BOX layer would diffuse into the active silicon, correcting any pre-existing dopant depletion.

DETAILED DESCRIPTION

Figure 1:
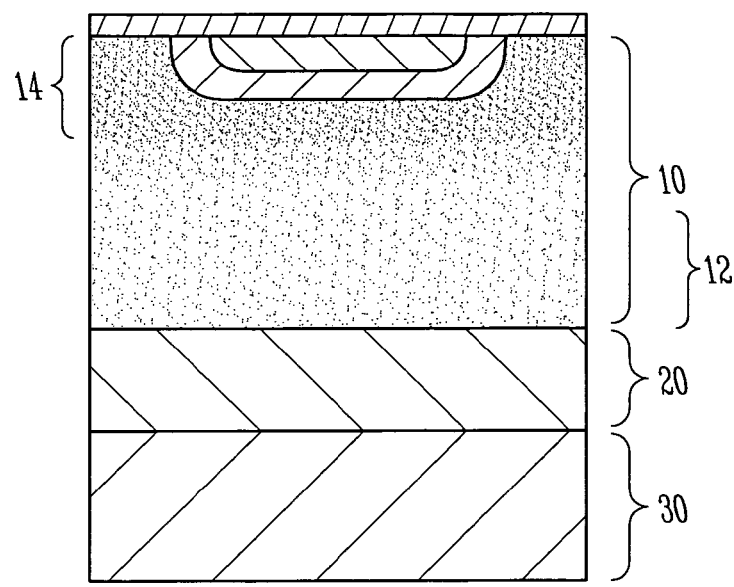
FIG. 1 is a cross-section of a prior art wafer showing the active silicon layer.

During semiconductor wafer manufacturing, as explained above, two wafers (a handle wafer and a bond wafer) are joined together to form a single unitary structure, an SOI wafer.

The wafers are initially cleaned in preparation for oxidation and bonding. A doping concentration (or doping concentration range) is selected, depending on the desired characteristics of the semiconductor devices to be constructed from the SOI wafer. In prior manufacturing methods the doping densities of the wafers to be joined were generally substantially the same. In the present methods and device, the doping range of the handle wafer is significantly increased. Either by diffusion or dopant segregation, the concentration of potential dopant atoms the BOX is correspondingly increased. For example, it the bond wafer has a doping concentration range of 1E14 to 1E16 dopant atoms per cubic centimeter ($cm^3$), the handle wafer doping range could be increased to 5E17 to 5E19 per $cm^3$. These dopant densities would be achieved using known methods for doping silicon wafers. For example, one method of doping is by adding boron to the melt from which the silicon ingot is pulled.

To date practical experience has been limited to boron, the most typical dopant. Other dopants should act in a more or less similar manner. The most practical dopants to use given the widely used temperatures of manufacturing are boron and phosphorous. Other dopants including arsenic, antimony and indium may also be used in practice of this invention, with consideration for their different segregation coefficients and diffusivities. These dopants diffuse more slowly, and could be used either with higher temperature processing, including the bonding process, with a thinner BOX layer, or, for a more shallow gradient in dopant profile in the active layer.

Following the cleaning of the wafers, the oxide layer (e.g., typically silicon dioxide) is grown on the handle wafer. Using standard manufacturing methods, a certain amount of dopant is incorporated into the BOX layer from the handle wafer during oxide growth, depending on the segregation coefficient of the dopant species and the original concentration of dopant in the handle wafer. By substantially increasing the dopant in the handle wafer, the BOX layer incorporates substantially more dopant. The increase of dopant concentration by 10 to 10^5 is advantageous depending on the thickness of the BOX layer. For 0.5 µm thickness a doping concentration of $5E18/cm^3$ would be the approximate concentration needed, given the use of boron, with a bond wafer initial doping level of $1E15/cm^3$. In this simulation, the BOX oxide layer was grown initially on the bond wafer.

Following the growing or depositing of the oxide layer on the handle wafer, the wafers are bonded together at a high temperature. The final thickness of the active silicon portion is established by etch back and chemical-mechanical polishing (CMP). In situations where it is preferable to have the actual dopant concentration higher at the bottom of the active silicon layer than at the top, the present method may be used, by further increasing the dopant concentration in the handle wafer than in the active silicon layer. As before, extra boron could be introduced in handle wafer and diffuse into the BOX layer and into the active layer. In this situation the dopant concentration in the active layer/Box interface is high than the dopant concentration in the body of the active layer. As before, additional dopant is sourced into the handle wafer and diffuses through the BOX into the bottom of the active layer. This would form a "field implant" layer on the bottom side of the active layer, at the BOX interface.

One result of increasing dopant at the BOX/active layer interface is the threshold voltage of the surface channel on the bottom surface of the active layer would be increased. In some structures, this would be beneficial in reducing leakage currents and could even form a "retrograde well" doping profile for the case where the designer is not building fully depleted MOSFETS in the SOI device.

Because of the relatively high concentration of the dopant in the BOX layer in the present methods, the net dopant motion into the BOX from the bond water during high temperature manufacturing is offset.

Figure 2:
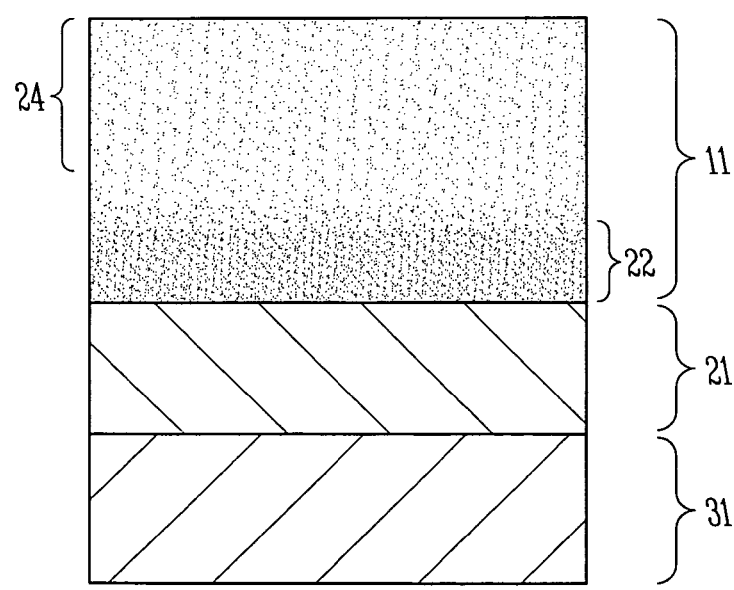
FIG. 2 is a cross section of a wafer illustrating one embodiment of the present invention.

With reference to FIG. 2, an active silicon layer 11 following manufacturing includes a top region 24 in which the dopant concentration is essentially the same as the initial concentration prior to the bonding of the bond wafer to the handle wafer. In lower region 22, the concentration of the dopant is actually higher than was found in the bond wafer prior to bonding. This increase in concentration is due to diffusion of dopant from the BOX layer 21 during high temperature bonding. The BOX layer 21 may have a dopant concentration gradient such that the dopant in the depth of the BOX adjacent to the handle wafer 31 is greater than the dopant concentration adjacent to the active silicon layer.

Figure 3:
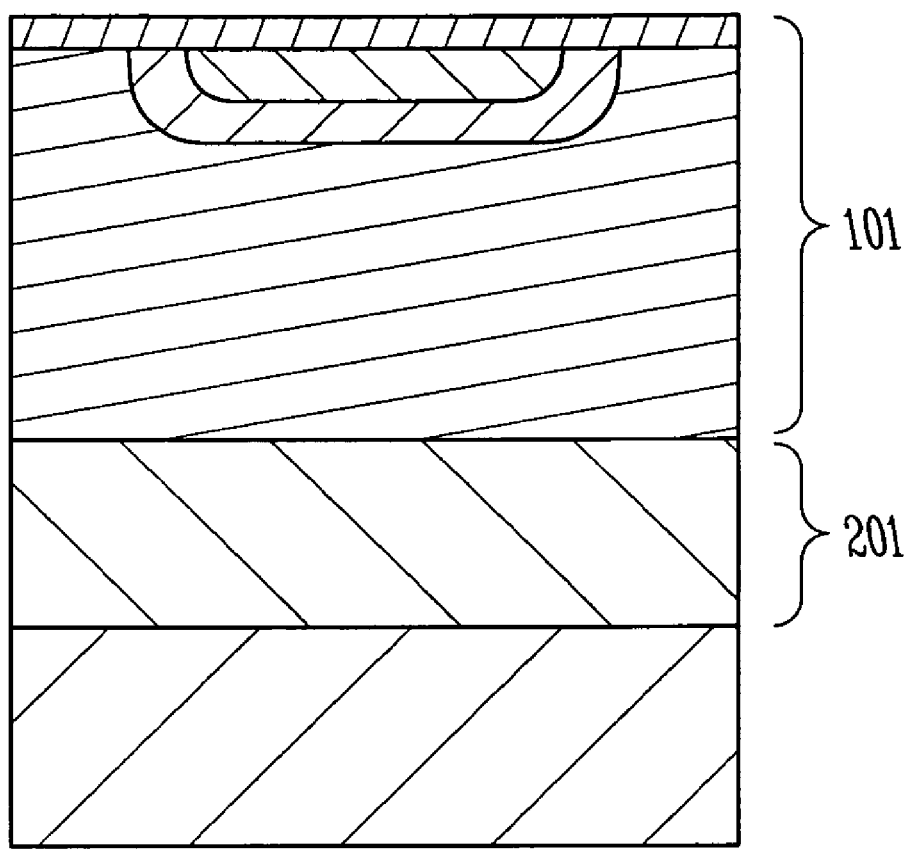
FIG. 3 is a cross section of a wafer illustrating an alternative embodiment of the present invention.

A cross section of a final wafer is shown in FIG. 3. The net motion of dopant into the BOX layer 201 from the bond wafer is offset, because of high concentration of the dopant in the BOX 201. The doping range in the active silicon layer remains substantially consistent through the full thickness of the active silicon layer. The depth of the active silicon in which the fabricated structures are manufactured has a relatively consistent doping range. This may mean that through the entire depth 101, the doping profile is not depleted from its original concentration. In prior devices, the dopant continues to deplete from the active silicon layer. In the present device, this dopant motion or diffusion is offset.

In the FIGS. 1-3 used to illustrate the present and past devices, elements are not drawn to scale and do not show details of fabricated devices. The present invention should be adaptable to a variety of dopants, BOX layer dimensions (e.g., thick, thin, and ultra thin BOX layers), wafer manufacturing methods, etc. In this application, the terms wafer is used at times to refer to both a bonded structure and an unbonded structure. Thus the handle wafer can either be an unbonded water or part of a structure bonded to the bond wafer to form a silicon on insulator wafer.

Further, term although the term wafer is used in describing exemplary embodiments described herein, a person of skill in the art will recognize that other types of substrates may be used instead of a handle for example.

The handle wafer and the bond wafer may be doped with any appropriate dopant: for example an N-type dopant (for example phosphorous) for PMOS devices, or a P-type dopant (for example boron) for NMOS devices. The buried oxide layer may be silicon dioxide or other oxide or dielectric layers.

In a specific exemplary embodiment, the active silicon may be 0.2 to 10 µm thick, the buried oxide layer may be 0.1 to 1 µm thick, and the handle wafer may be 500-1000 µm thick. These dimensions again are given by way of illustration. Different thickness may be required depending on the ultimate integrated circuit to be manufactured.

What is claimed is:

1. A semiconductor material comprising:
   a bond substrate layer having a first dopant concentration including a field implant layer on a bottom side of the bond substrate layer, and including a retrograde well doping profile in the bond substrate layer;
   a buried oxide layer adjacent to said bond substrate layer, the buried oxide layer having a dopant gradient within the buried oxide layer; and
   a handle layer adjacent to said buried oxide layer, the handle layer having a substantially uniform dopant concentration sufficiently higher than said first dopant concentration such that dopant in the field implant layer adjacent to the buried oxide layer does not have a substantially lower dopant concentration than the dopant concentration in a region of said bond substrate layer relatively distal from said buried oxide layer.

2. The material of claim 1, wherein said bond substrate layer is 0.2 to 5 micrometers in thickness.

3. The material of claim 1, wherein said buried oxide layer is 0.1 to 1 micrometers thick.

4. The material of claim 1, wherein said handle layer is 500 to 1000 micrometers thick.

5. The material of claim 1, wherein said handle layer has the substantially uniform dopant concentration between 5 E 17 to 1 E 19 dopant atoms per cubic centimeter.

6. A semiconductor wafer comprising:
- a bond substrate layer including an active silicon layer having a top region and an adjacent lower region, the lower region including a field implant layer on a bottom side of the bond substrate layer, the bond substrate layer including a retrograde well doping profile;
- a buried oxide layer adjacent to the field implant layer, the buried oxide layer having a dopant gradient such that a dopant concentration in the buried oxide layer distal from the bond substrate layer is greater than a dopant concentration in the buried oxide layer adjacent to the bond substrate layer; and
- a handle layer adjacent to the buried oxide layer, the handle layer having a substantially uniform dopant concentration that is higher than a dopant concentration of the bond substrate layer.

7. The semiconductor wafer of claim 6, wherein the bond substrate layer, the buried oxide layer, and the handle layer include boron.

8. The semiconductor wafer of claim 6, wherein the bond substrate layer, the buried oxide layer, and the handle layer include indium.

9. The semiconductor wafer of claim 6, wherein the bond substrate layer, the buried oxide layer, and the handle layer include phosphorous.

10. The semiconductor wafer of claim 6, wherein the buried oxide layer includes silicon dioxide.

11. The semiconductor wafer of claim 6, wherein a final thickness of the active silicon layer is established by etch back and chemical-mechanical polishing.

12. The semiconductor wafer of claim 6, wherein the active silicon layer is 0.2 to 10 micrometers thick, the buried oxide layer is 0.1 to 1 micrometers thick, and the handle layer is 500 to 1000 micrometers thick.

13. The semiconductor wafer of claim 6, wherein the buried oxide layer is grown on the handle layer prior to bonding of the buried oxide layer to the bond substrate layer.

* * * * *

UNITED STATES PATENT AND TRADEMARK OFFICE
CERTIFICATE OF CORRECTION

PATENT NO. : 7,629,649 B2  
APPLICATION NO. : 11/382455  
DATED : December 8, 2009  
INVENTOR(S) : Miller et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 180 days.

Signed and Sealed this

Twenty-first Day of December, 2010

David J. Kappos  
*Director of the United States Patent and Trademark Office*